United States Patent
Ogawa

(10) Patent No.: US 7,319,422 B2
(45) Date of Patent: *Jan. 15, 2008

(54) APPARATUS AND METHOD FOR AD CONVERSION

(75) Inventor: Makoto Ogawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/101,513

(22) Filed: Apr. 8, 2005

(65) Prior Publication Data

US 2005/0231413 A1   Oct. 20, 2005

(30) Foreign Application Priority Data

Apr. 9, 2004   (JP)   ............................. 2004-115200

(51) Int. Cl.
*H03M 1/12*   (2006.01)
(52) U.S. Cl. ..................................... 341/155; 341/141
(58) Field of Classification Search ................ 341/141, 341/155, 161, 122
See application file for complete search history.

(56) References Cited

U.S. PATENT DOCUMENTS

| | | | | |
|---|---|---|---|---|
| 5,172,116 | A | | 12/1992 | Noma ......................... 341/155 |
| 5,208,545 | A | * | 5/1993 | Schweitzer, III ............. 341/123 |
| 5,212,483 | A | * | 5/1993 | Wakimoto ................... 341/141 |
| 5,291,197 | A | * | 3/1994 | Abe ............................ 341/141 |
| 5,541,601 | A | * | 7/1996 | Goto et al. .................. 341/141 |
| 5,691,719 | A | * | 11/1997 | Wakimoto ................... 341/141 |
| 6,188,342 | B1 | * | 2/2001 | Gallo .......................... 341/137 |
| 6,201,492 | B1 | * | 3/2001 | Amar et al. ................. 341/155 |
| 6,239,732 | B1 | * | 5/2001 | Cusey ......................... 341/155 |
| 6,573,852 | B2 | * | 6/2003 | Knapp ........................ 341/155 |
| 6,653,963 | B1 | * | 11/2003 | Barrenscheen et al. ..... 341/155 |
| 6,703,961 | B2 | * | 3/2004 | Mueck et al. ............... 341/161 |
| 6,795,010 | B1 | * | 9/2004 | Potlapalli et al. ........... 341/155 |
| 2002/0169902 | A1 | * | 11/2002 | Horiuchi et al. ............. 710/69 |
| 2005/0040978 | A1 | * | 2/2005 | Morita et al. ............... 341/141 |

FOREIGN PATENT DOCUMENTS

JP    4-88723    3/1992

* cited by examiner

*Primary Examiner*—Peguy JeanPierre
(74) *Attorney, Agent, or Firm*—Foley And Lardner LLP

(57) ABSTRACT

An analog-to-digital (AD) converting apparatus includes a register, a selecting section and an AD converting section. The register holds a channel specifying data indicating whether each of a plurality of analog signals should be subjected to an AD conversion. The selecting section is connected with a plurality of analog input channels from which the plurality of analog signals are supplied, and sequentially selects ones of the plurality of analog input channels based on the channel specifying data held by the register. The AD converting section carries out the AD conversion of the analog signals on the selected analog input channels into digital signals in order. The channel specifying data contains a plurality of channel data corresponding to the plurality of analog input channels, and each of the plurality of channel data is set when the AD conversion should be carried out to the analog signal on the analog input channel corresponding to the set channel data.

19 Claims, 7 Drawing Sheets

Fig. 2 PRIOR ART

```
                        bit3 bit2 bit1 bit0
CHANNEL SPECIFYING DATA [ 0 | 0 | 1 | 1 ]  ←SPECIFY CHANNEL 3
```

Fig. 3 PRIOR ART

```
              bit7 bit6 bit5 bit4 bit3 bit2 bit1 bit0
CHANNEL
SPECIFYING  [ 0  | 1  | 1  | 1  | 0  | 0  | 1  | 1 ]   ←SPECIFY
  DATA        _____/     _____/      CHANNELS 3 TO 7
                END CHANNEL         START CHANNEL
```

Fig. 5

| | CHn | | CH3 | CH2 | CH1 | CH0 |
|---|---|---|---|---|---|---|
| CHANNEL SPECIFYING DATA | CDn | · · · | CD3 | CD2 | CD1 | CD0 |

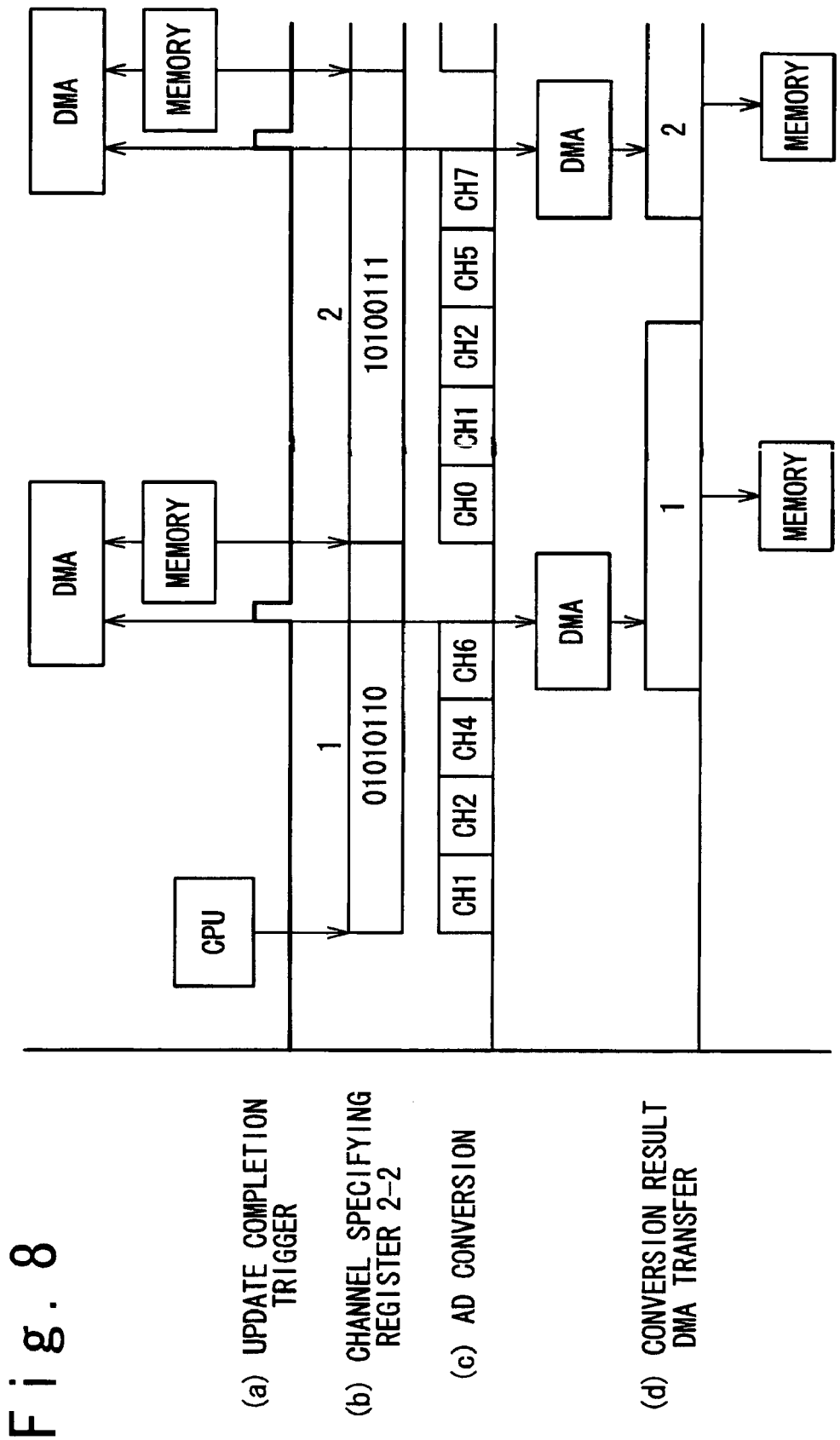

APPARATUS AND METHOD FOR AD CONVERSION

BACKGROUND OF THE INVENTION

1. Field of the Invention

The present invention relates to an AD converting apparatus and an AD converting method.

2. Description of the Related Art

There is a case of converting a large number of analog signals into digital signals (AD conversion). In this case, it is not economically efficient to provide an AD converting apparatus for each analog signal. For this reason, it is considered to provide one AD converter for the plurality of analog signals and to carry out the AD conversion while switching the input analog signals.

A conventional AD converting apparatus is disclosed in Japanese Laid Open Patent Application (JP-A-Heisei 4-88723). FIG. 1 is a diagram showing a configuration of the conventional AD converting apparatus. The conventional AD converting apparatus is provided with a multiplexer 54, an AD converter 56, a result storing buffer 58, a CPU 60, a bus 62 and a controller 70. The multiplexer 54 selects one from a plurality of analog input terminals in accordance with an input terminal specification signal from the controller 70. The AD converting section 56 converts an analog signal of the analog input terminal selected by the multiplexer into a digital signal and stores a conversion result in the result storing buffer 58. The controller 70 outputs the input terminal specification signal to the multiplexer 54 in accordance with an AD conversion order that is arbitrarily specified.

The controller 70 has a channel specifying register 52. The conventional AD converting apparatus has a selection mode and a scan mode. For example, as shown in FIG. 2, when the channel specifying data to specify an analog input terminal "3" is set in the channel register 52 by the CPU 60 in the selection mode, the analog signal from the analog input channel corresponding to "3" is fixedly converted into the digital signal. Also, in the scan mode, all of the analog input channels are selected in order from the analog input channels specified by the channel specifying data held in the channel specifying register 52 of the controller 70, and the analog signal of the selected analog input channel is converted into the digital signal.

In the conventional AD converting apparatus, when the analog input channels "0 to 2" are specified, the analog signals from the analog input channels corresponding to "0", "1" and "2" are converted into the digital signals in the selection mode. Thus, the AD converting section 56 is intermittently stopped, which makes it inefficient.

Also, in the conventional AD converting apparatus, even if a conversion cycle to be AD-converted is different for each analog signal, the conversion cycle cannot be changed for each analog signal. If the conversion cycle is arbitrarily changed, the CPU needs to receive an interruption and again to set a channel specifying data in the register. However, this implies that the AD conversion is not carried out until a new channel specifying data is set. A period until the interruption is received or a bus occupation of DMA is assumed, and a period while the AD converter is stopped is unstable. Thus, a time schedule cannot be set unless any circuit such as a timer that is periodically operated is used. Moreover, a limit of an assignment of the analog input channel and a load of a software process of CPU are generated.

For these reasons, the channel specifying data shown in FIG. 3 has been conventionally used so as to be able to freely set the analog input channel of the analog signal. In the channel specifying data, the lower four-bit specifies a start channel (analog input channel) for the AD conversion, and the higher four-bit specifies an end channel (analog input channel) for the AD conversion. For example, if the AD converting apparatus specifies the analog input channels "0 to 2", the start channel is "0", and the end channel is "2". Through the usage of the foregoing channel specifying data, the analog signals of the channels within the specified range can be converted into the digital signals.

However, in the AD converting apparatus that uses the foregoing channel specifying data, if "0", "2" and "4" are specified as the necessary analog input channels, the analog signals from the analog input channels corresponding to "0", "2" and "4" are converted into the digital signals at the selection mode. Thus, the AD converting section is intermittently stopped, like the conventional AD converting apparatus in FIG. 1. Also, since the specifying method of the analog input channel is based on the range specification, only the necessary analog input channel cannot be selected.

SUMMARY OF THE INVENTION

In an aspect of the present invention, an analog-to-digital (AD) converting apparatus includes a register, a selecting section and an AD converting section. The register holds a channel specifying data indicating whether each of a plurality of analog signals should be subjected to an AD conversion. The selecting section is connected with a plurality of analog input channels from which the plurality of analog signals are supplied, and sequentially selects ones of the plurality of analog input channels based on the channel specifying data held by the register. The AD converting section carries out the AD conversion of the analog signals on the selected analog input channels into digital signals in order.

The channel specifying data contains a plurality of channel data corresponding to the plurality of analog input channels, and each of the plurality of channel data is set when the AD conversion should be carried out to the analog signal on the analog input channel corresponding to the set channel data. The selecting section searches the plurality of channel data of the channel specifying data held by the register for the set channel data, and selects the analog input channels corresponding to the set channel data in order. In this case, each of the plurality of channel data may be a 1-bit data, and the selecting section may search the channel specifying data for the set channel data in order from a least significant bit. Alternatively, each of the plurality of channel data may be a 1-bit data, and the selecting section may search the channel specifying data for the set channel data in order from a most significant bit.

Also, the AD converting apparatus may further include a buffer in which the AD converting section stores the digital signals. In this case, the AD converting apparatus may further include a bus; and a control section configured to read out the digital signals from the buffer onto the bus. Also, the AD converting apparatus may further include a bus; a memory; a DMA unit; and a control unit configured to control the DMA unit to transfer the digital signals from the buffer into the memory through the bus.

Also, the AD converting apparatus may further include a memory which stores a plurality of the channel specifying data; and a control section configured to read out a channel specifying data from the memory in response to an AD conversion command and to set the read-out channel specifying data in the register. In this case, the AD converting section may generate a conversion completion trigger immediately before completion of the AD conversion for the channel specifying data, and the control section may read out a next channel specifying data from the memory in response to the conversion completion trigger and set the read-out next channel specifying data in the register.

Also, the AD converting apparatus may further include a memory which stores a plurality of the channel specifying data; a DMA unit; and a control section configured to control the DMA unit to read out a channel specifying data from the memory in response to an AD conversion command and to set the read-out channel specifying data in the register. In this case, the AD converting section may generate a conversion completion trigger immediately before completion of the AD conversion for the channel specifying data. The control section may control the DMA unit to read out a next channel specifying data from the memory in response to the conversion completion trigger and to set the read-out next channel specifying data in the register.

In another aspect of the present invention, an analog-to-digital (AD) converting method is achieved by holding in a register, a channel specifying data indicating whether each of a plurality of analog signals should be subjected to an AD conversion; by sequentially selecting ones of a plurality of analog input channels from which the plurality of analog signals are supplied, based on the channel specifying data; and by carrying out the AD conversion of the analog signals on the selected analog input channels into digital signals in order.

Here, the channel specifying data may contain a plurality of channel data corresponding to the plurality of analog input channels, and each of the plurality of channel data may be set when the AD conversion should be carried out to the analog signal on the analog input channel corresponding to the set channel data. The selecting may be achieved by searching the channel specifying data for the set channel data, to select the analog input channels corresponding to the set channel data in order. Also, the carrying out may include storing the digital signals in a buffer.

Also, the AD converting method may be achieved by further reading out the digital signals from the buffer onto a memory. In this case, the reading out may include controlling a DMA unit to transfer the digital signals from the buffer into the memory.

Also, the AD converting method may be achieved by further reading out the channel specifying data from the memory in response to an AD conversion command to set the read-out channel specifying data in the register.

Also, the AD converting method may be achieved by further generating a conversion completion trigger immediately before completion of the AD conversion for the channel specifying data; and by reading out a next channel specifying data from the memory in response to the conversion completion trigger to set the read-out next channel specifying data in the register. In this case, the reading out a next channel specifying data may be achieved by controlling a DMA unit to read out the next channel specifying data from the memory in response to the conversion completion trigger to set the read-out next channel specifying data in the register.

BRIEF DESCRIPTION OF THE DRAWINGS

FIG. 2 is a diagram showing an example of a channel specifying data used in the conventional AD converting apparatus;

FIG. 3 is a diagram showing another example of the channel specifying data used in another conventional AD converting apparatus;

FIG. 5 is a diagram showing an example of a channel specifying data used in the AD converting apparatus according to the first embodiment of the present invention;

FIG. 8 is a diagram showing an operation of the AD converting apparatus according to the second embodiment of the present invention.

DESCRIPTION OF THE PREFERRED EMBODIMENTS

Hereinafter, an analog-to-digital (AD) converting apparatus of the present invention will be described in detail with reference to the attached drawings.

Figure 1:
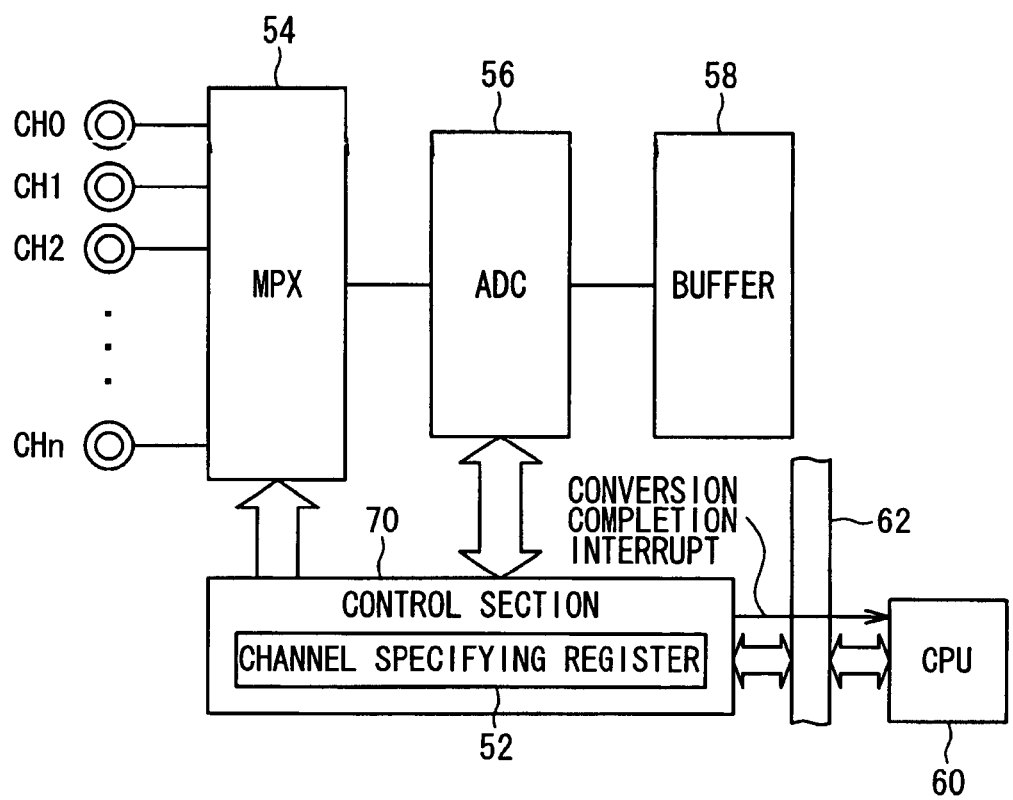
FIG. 1 is a block diagram showing a configuration of a conventional AD converting apparatus.
Figure 4:
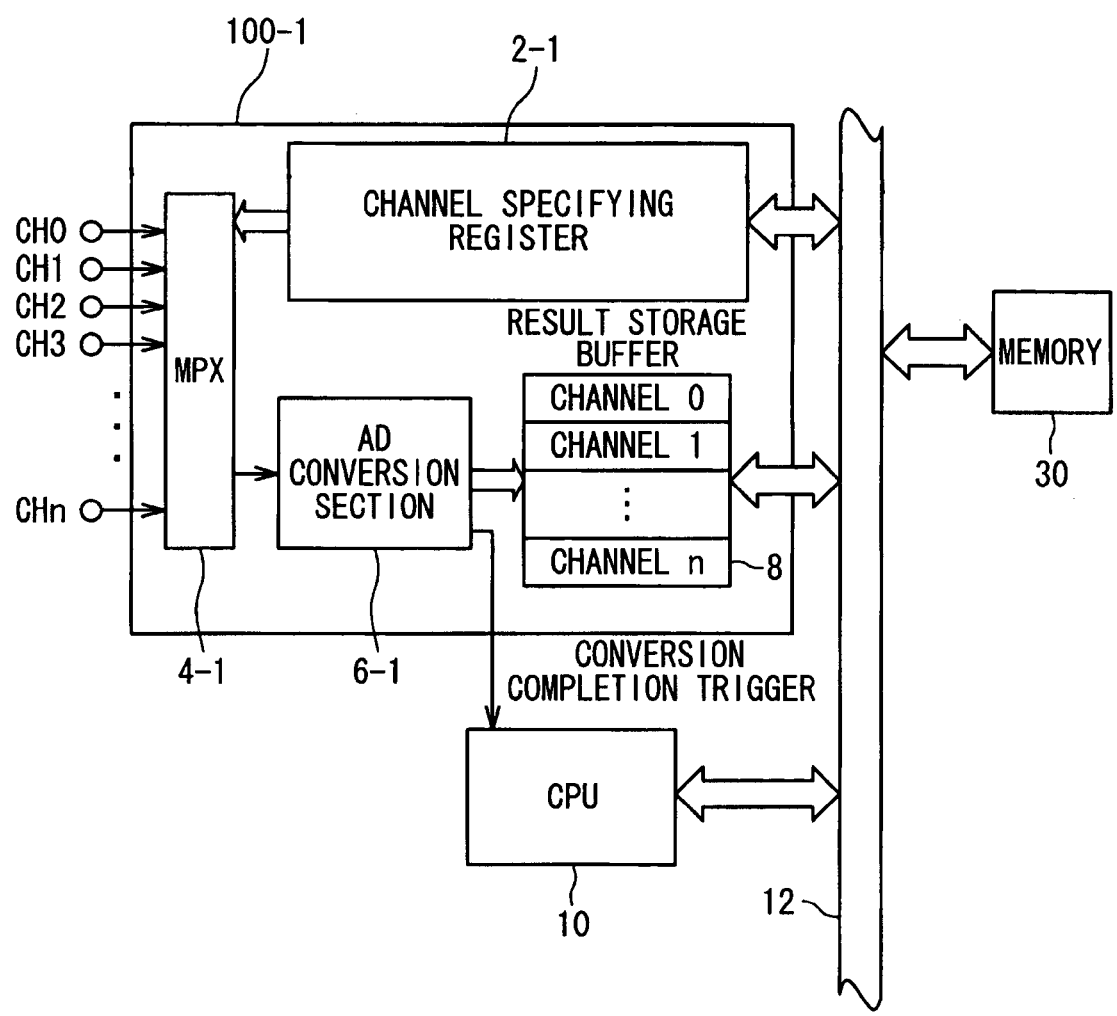
FIG. 4 is a block diagram showing a configuration of an AD converting apparatus according to a first embodiment of the present invention.

FIG. 4 is a block diagram showing a hardware configuration of the AD converting apparatus according to the first embodiment of the present invention. The AD converting apparatus in the first embodiment is provided with an AD converter 100-1, a CPU 10 and a memory 30. The AD converter 100-1, the CPU 10 and the memory 30 are connected to a bus 12. The AD converter 100-1 has a channel specifying register 2-1, a multiplexer (MPX) 4-1 serving as a selector, an AD converting section 6-1 and a result storing buffer 8.

The channel specifying register 2-1 latches and holds a channel specifying data. The channel specifying data is a data for specifying at least one analog input channel individually and independently. The channel specifying register 2-1 is connected to the bus 12. At the initial stage of an AD conversion, the channel specifying register 2-1 latches and holds the channel specifying data from the bus 12 in response to a hold instruction signal from the CPU 10. After the AD converting process, the channel specifying register 2-1 latches and holds a new channel specifying data from the bus 12 in response to the hold instruction from the CPU 10.

A plurality of analog input channels CH0 to CHn (n is an integer) are connected to the multiplexer 4-1. Each analog input channel CHj (j=0, 1, 2 to n) supplies an analog signal to the multiplexer 4-1. The multiplexer 4-1 decodes the channel specifying data held by the channel specifying register 2-1 and selects the analog input channel(s) from among the plurality of analog input channels CH0 to CHn in accordance with the decoded results. The multiplexer 4-1 outputs the analog signal on the selected analog input channel to the AD converting section 6-1. At this time, the multiplexer 4-1 outputs a data indicating the selected analog input channel to the AD converting section 6-1, in addition to the analog signal. When the specified channel is the last specified by the channel specifying data, the multiplexer 4-1 outputs a data indicating the fact to the AD converting section 6-1.

The result storing buffer 8 has result storing regions respectively corresponding to the plurality of analog input channels CH0 to CHn. The AD converting section 6-1 converts the analog signal supplied by the multiplexer 4-1 into a digital signal within an AD conversion period. Then, the AD converting section 6-1 stores the conversion result in an appropriate result storing region of the result storing buffer 8 in accordance with the data indicating the selected analog input channel. Also, when receiving the data indicating the last analog input channel from the multiplexer 4-1, the AD converting section 6-1 converts the analog signal supplied by the multiplexer 4-1 into the digital signal, stores the conversion result in an appropriate result storing region of the result storing buffer 8 in accordance with the data indicating the selected analog input channel, and generates and outputs a conversion completion trigger signal to the CPU 10 immediately before the end of the AD conversion period.

When receiving an AD conversion command, the CPU 10 reads out a new channel specifying data from the memory 30 at the initial stage of the AD converting process, and sets in the channel specifying register 2-1. Also, the CPU 10 instructs the AD converting section 6-1 and the multiplexer 6-1 to start the AD converting process. Also, the CPU 10 reads out the digital signal stored in the result storing region of the result storing buffer 8 and stores in the memory 30 through the bus 12. In addition, the CPU 10 reads out a next channel specifying data from the memory 30 and sets in the channel specifying register 2-1 in response to the conversion completion trigger signal from the AD converting section 6-1.

Next, with reference to FIG. 5, the channel specifying data used in the AD converting apparatus according to the first embodiment of the present invention will be described below. The channel specifying data includes a plurality of channel data CD0 to CDn. In this example, the channel data is a 1-bit data. At least one of the plurality of channel data CD0 to CDn specifies the analog input channel (CH) corresponding to the analog signal on which the AD conversion is to be carried out. The plurality of channel data CD0 to CDn are arrayed from the first channel data to the last channel data in this order. The channel specifying data is represented by a plurality bits. The least significant bit (bit 0) of the channel specifying data indicates the first channel data CD0. The most significant bit (bit n) thereof indicates the last channel data CDn. The plurality of channel data CD0 to CDn are represented by "1" or "0". If the channel data CDj (j=0, 1, 2 to n) is "1", this specifies the analog input channel CHj corresponding to the analog signal on which the AD conversion is to be carried out.

Figure 6:
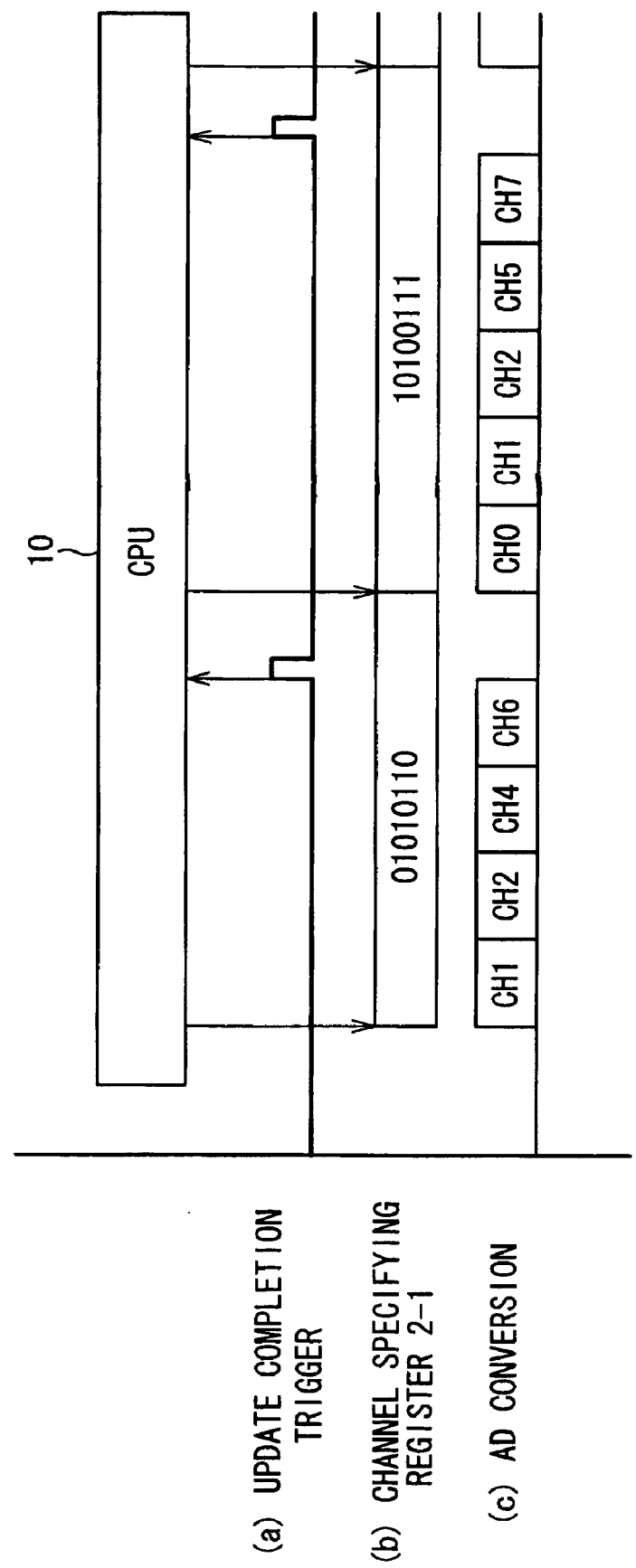
FIG. 6 is a diagram showing an operation of the AD converting apparatus according to the first embodiment of the present invention.

An operation of the AD converting apparatus according to the first embodiment of the present invention will be described below with reference to FIG. 6. Here, in order to simplify the description, it is supposed that the channel specifying data has 8 bits and the foregoing n is 7. When the AD conversion command is supplied to the CPU 10, the CPU 10 reads out a channel specifying data "01010110" on the bus 12 from the memory 30 at the initial stage of the AD converting process, and outputs the hold instruction to the channel specifying register 2-1. Thus, as shown in (b) of FIG. 6, the channel specifying data "01010110" is latched and held in the channel specifying register 2-1. In this way, the initial process of the AD converting process is ended.

Next, the CPU 10 outputs a conversion start command to the AD converting section 6-1 and the multiplexer 6-1. As shown in (c) of FIG. 6, the AD converting section 6-1 starts the AD converting process in response to the conversion start command. At this time, the multiplexer 4-1 decodes the channel specifying data "01010110" for the plurality of channel data CD0 to CDn. That is, the multiplexer 4-1 searches the channel specifying data "01010110" for a bit of "1" from the first channel data CD0 to the last channel data CDn in order, and determines that the analog input channels CH1, CH2, CH4 and CH6 are specified in this order as the AD conversion analog input channels. The analog input channel CH1 of the AD conversion analog input channels CH1, CH2, CH4 and CH6 is the AD conversion start analog input channel, and the analog input channel CH6 is the AD conversion last analog input channel. Then, the multiplexer 4-1 firstly selects the analog signal on the analog input channel CH1 and supplies the analog signal on the analog input channel CH1 to the AD converting section 6-1 together with the data indicating the analog input channel CH1. The AD converting section 6-1 converts the analog signal supplied by the multiplexer 4-1 to the digital signal within the conversion period. The digital signal after the conversion is stored in an appropriate result storing region "Channel 1" of the result storing buffer 8 in accordance with the data indicating the analog input channel CH1 from the multiplexer 4-1.

Next, the multiplexer 4-1 selects and supplies the analog signal on the analog input channel CH2 to the AD converting section 6-1 together with the data indicating the analog input channel CH2. The AD converting section 6-1 converts the analog signal supplied by the multiplexer 4-1 to the digital signal within the conversion period. The digital signal after the conversion is stored in an appropriate result storing region "Channel 2" of the result storing buffer 8 in accordance with the data indicating the analog input channel CH2.

In succession, the multiplexer 4-1 selects and supplies the analog signal on the analog input channel CH4 to the AD converting section 6-1 together with the data indicating the analog input channel CH4. The AD converting section 6-1 converts the analog signal supplied by the multiplexer 4-1 to the digital signal within the conversion period. The digital signal after the conversion is stored in an appropriate result storing region "Channel 4" of the result storing buffer 8 in accordance with the data indicating the analog input channel CH4.

In succession, when selecting the analog signal on the analog input channel CH6, the multiplexer 4-1 supplies the analog signal on the analog input channel CH6 to the AD converting section 6-1 together with the data indicating the analog input channel CH6 and a data indicating that the analog input channel CH6 is the AD conversion last analog input channel. The AD converting section 6-1 converts the analog signal supplied by the multiplexer 4-1 into the digital signal within the conversion period. The digital signal after the conversion is stored in an appropriate result storing region "Channel 6" of the result storing buffer 8 in accordance with the data indicating the analog input channel CH6. At this time, as shown in (a) of FIG. 6, the AD converting section 6-1 outputs a conversion completion trigger signal to the CPU 10 immediately before the end of the AD conversion period of the analog signal on the analog input channel CH6 in accordance with the data indicating the AD conversion last analog input channel. The CPU 10 reads out a next channel specifying data "10100111" from the memory 30 in response to the conversion completion trigger signal and supplies through the bus 12 to the channel specifying register 2-1. As shown in (b) of FIG. 6, the channel specifying register 2-1 latches and holds the channel specifying data "10100111" in response to the hold instruction signal from the CPU 10, before the completion of the AD conversion process for the channel specifying data. In succession, the CPU 10 reads out the stored digital signal from the result storing buffer 8 and stores in the memory 30 through the bus 12.

Through the foregoing process, the analog signals supplied to the AD converting section 6-1 for the respective analog input channels of the channel specifying data "01010110" are subjected to the AD conversion process from "CH1", to "CH2", "CH4" and "CH6" in order. The analog signals from the multiplexer 4-1 are converted into the digital signals by the AD converting section 6-1 and stored in the appropriate result storing regions of the result storing buffer 8 in order. After that, they are stored in the memory 30 through the bus 12. Immediately before the AD converting process corresponding to one channel specifying data is ended, the conversion completion trigger signal is outputted, and the AD converting process is carried out to the next channel specifying data "10100111".

As mentioned above, in the AD converting apparatus according to the first embodiment of the present invention, the multiplexer 4-1 selects the analog input channels CH1, CH2, CH4 and CH6 in order in accordance with one channel specifying data "01010110". The analog signals on the analog input channels CH1, CH2, CH4 and CH6 selected by the multiplexer 4-1 are converted into the digital signals by the AD converting section 6-1. Also, in the AD converting apparatus according to the first embodiment of the present invention, the conversion completion trigger signal is outputted by the AD converting section 6-1 immediately before the end of the AD conversion process to the single channel specifying data "01010110". When the AD conversion of each of the analog input channels CH1, CH2 and CH4 of the channel specifying data "01010110" other than the AD conversion last analog input channel CH6 have been only ended, the conversion completion trigger signal is not outputted. That is, the AD converting section 6-1 outputs the conversion completion trigger signal immediately before the AD conversion process to the analog input channels CH1, CH2, CH4 and CH6 is completed. Thus, since the multiplexer 4-1 selects the analog input channels CH1, CH2, CH4 and CH6 in order in accordance with one channel specifying data "01010110", the AD converting section 6-1 can continuously carry out the AD conversion on the analog signals on the analog input channels CH1, CH2, CH4 and CH6. Also, a series of the channel specifying data are set in the channel specifying register 2-1 in response to the conversion completion trigger in order. Thus, the digital signal can be obtained at a proper timing without any wait or idle time between the channel specifying data. In the AD converting apparatus according to the first embodiment of the present invention, all the analog input channels CH1, CH2, CH4 and CH6 can be optionally selected in the single channel specifying data, it is possible to reduce the number of the necessary registers.

Figure 7:
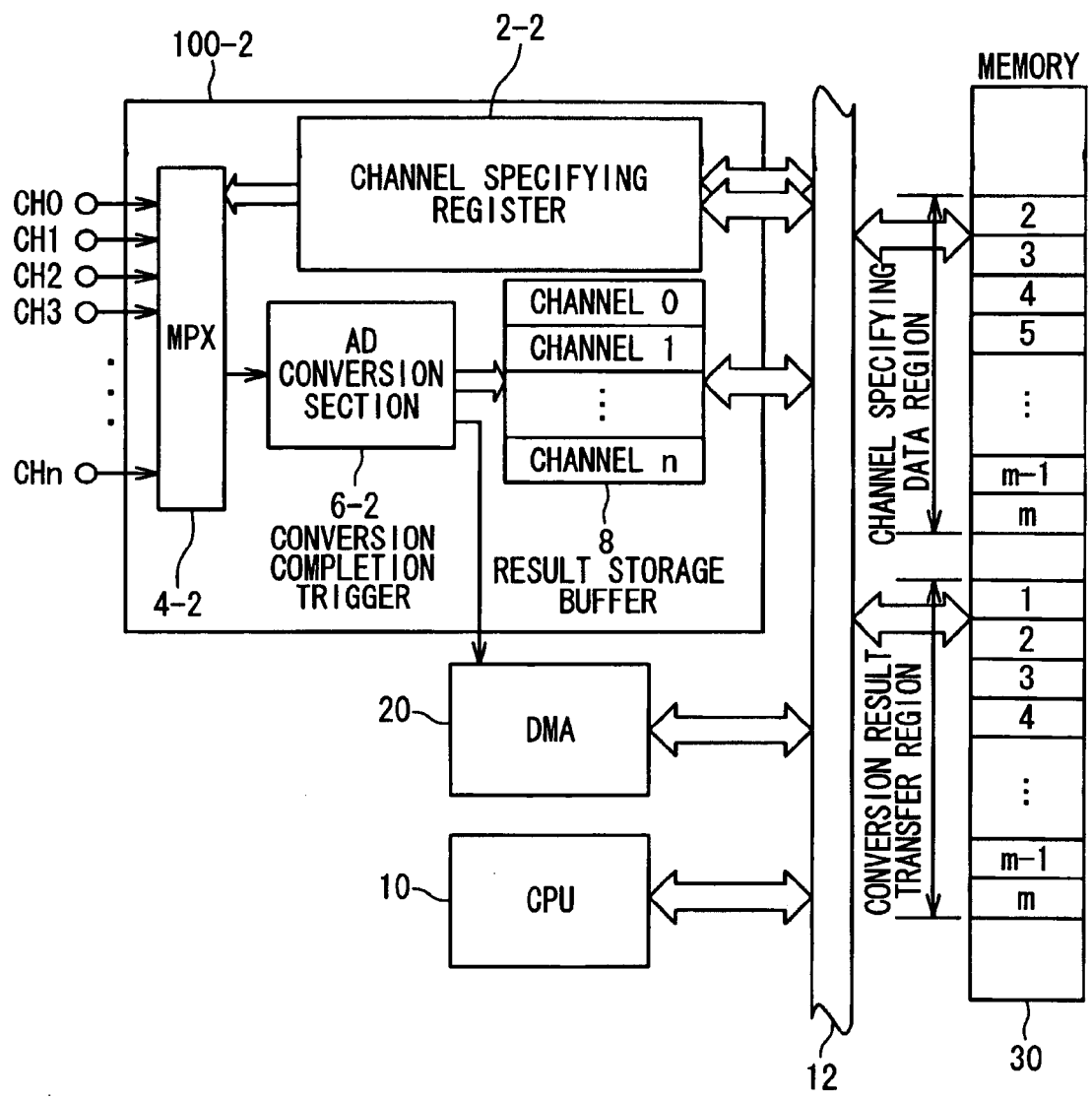
FIG. 7 is a diagram showing a configuration of an AD converting apparatus according to a second embodiment of the present invention.

FIG. 7 is a block diagram showing a hardware configuration of the AD converting apparatus according to the second embodiment of the present invention. In the AD converting apparatus according to the first embodiment, the transfer of the channel specifying data and the transfer of the conversion result data are carried out by the CPU 10. However, they may be carried out by a DMA unit 20. The AD converting apparatus in the second embodiment has an AD converter 100-2, the CPU 10, the DMA unit 20 and the memory 30. The AD converter 100-2, the CPU 10, the DMA unit 20 and the memory 30 are connected to the bus 12. The AD converter 100-2 has a channel specifying register 2-2, a multiplexer 4-2 serving as a selector, an AD converting section 6-2 and the result storing buffer 8.

The channel specifying register 2-2 latches and holds a channel specifying data. The configuration of this channel specifying register 2-2 is the same as the channel specifying register 2-1 of the first embodiment. That is, the channel specifying register 2-2 is connected to the bus 12. The channel specifying data is the same as the channel specifying data of the first embodiment. At the initial stage of the AD conversion process, the channel specifying register 2-2 latches and holds the channel specifying data in response to the hold instruction from the CPU 10. Immediately before the completion of the AD converting process, the channel specifying data is read out from the memory 30 by the DMA unit 20, and set in the channel specifying register 2-2.

A plurality of analog input channels CH0 to CHn (n is an integer) are connected to the multiplexer 4-2. Each analog input channel CHj (j=0, 1, 2 to n) supplies the analog signal to the multiplexer 4-2. The multiplexer 4-2 decodes the channel specifying data held by the channel specifying register 2-2 and selects ones of the plurality of analog input channels CH0 to CHn in order in accordance with the decoded result. The multiplexer 4-2 outputs the analog signals on the selected analog input channel to the AD converting section 6-2 in order. At this time, the multiplexer 4-2 also outputs the data indicating the selected analog input channel. When the selected channel is the last analog input channel specified based on the channel specifying data, the multiplexer 4-2 also outputs the data indicating the fact to the AD converting section 6-2.

The result storing buffer 8 has the result storing regions corresponding to the plurality of analog input channels CH0 to CHn, respectively. The AD converting section 6-2 converts the analog signal supplied by the multiplexer 4-2 into the digital signal within an AD conversion period. After that, the AD converting section 6-2 stores the conversion result in the appropriate result storing region of the result storing buffer 8 in accordance with the data indicating the selected analog input channel. Also, when receiving the data indicating the last analog input channel from the multiplexer 4-2, the AD converting section 6-2 converts the analog signal supplied by the multiplexer 4-2 into the digital signal, and stores the conversion result in the appropriate result storing region of the result storing buffer 8 in accordance with the data indicating the selected analog input channel. In addition, the AD converting section 6-2 generates the conversion completion trigger signal immediately before the completion of the AD conversion process, and outputs to the DMA unit 20.

The CPU 10 controls the DMA unit 20 to read out the channel specifying data from the memory 30 at the initial stage of the AD converting process in response to the AD conversion command, and to set in the channel specifying register 2-2. Also, when the AD converting process is started, the DMA unit 20 reads out a next channel specifying data from the memory 30 in response to the conversion completion trigger signal from the AD converting section 6-2, and sets in the channel specifying register 2-2. Also, the DMA unit 20 reads out the digital signals stored in the result storing regions of the result storing buffer 8 and stores in the memory 30 through the bus 12.

The operation of the AD converting apparatus according to the second embodiment of the present invention will be described below with reference to FIG. 8. Here, similarly to the first embodiment, it is supposed that the channel specifying data has 8 bits and the foregoing n is 7. When the AD conversion command is supplied to the CPU 10, the CPU 10 controls the DMA unit 20 to read out the channel specifying data "01010110" on the bus 12 from the memory 30 at the initial stage of the AD conversion, and to output the hold instruction to the channel specifying register 2-2. Thus, as shown in (b) of FIG. 8, the channel specifying data "01010110" is held in the channel specifying register 2-2. In this way, the initial process of the AD converting process is ended.

Next, the CPU 10 outputs the conversion start command to the AD converting section 6-2 and the multiplexer 4-2. As shown in (c) of FIG. 8, the AD converting section 6-2 starts the AD converting process in response to the conversion start command. At this time, the multiplexer 4-2 decodes "01010110" of the channel specifying data for the plurality of channel data CD0 to CDn, and searches the plurality of channel data CD0 to CDn for a bit of "1" from the first channel data CD0 to the last channel data CDn in this order, and then determines that the analog input channels CH1, CH2, CH4 and CH6 are specified in this order as the AD conversion analog input channels. The analog input channel CH1 of the AD conversion analog input channels CH1, CH2, CH4 and CH6 is the AD conversion start analog input channel, and the analog input channel CH6 is the AD conversion last analog input channel. After that, the multiplexer 4-2 selects the analog signal on the analog input channel CH1 and supplies the analog signal on the analog input channel CH1 to the AD converting section 6-2 together with the data indicating the analog input channel CH1. The AD converting section 6-2 converts the analog signal supplied by the multiplexer 4-2 to the digital signal within the AD conversion period. The digital signal after the conversion is stored in the appropriate result storing region "Channel 1" of the result storing buffer 8 in accordance with the data indicating the analog input channel CH1 from the multiplexer 4-2. The similar process is carried out on the analog input channels CH2 and CH4.

In succession, when selecting the analog signal on the analog input channel CH6, the multiplexer 4-2 supplies the analog signal on the analog input channel CH6 to the AD converting section 6-2, together with the data indicating the analog input channel CH6 and a data indicating that the analog input channel CH6 is the AD conversion last analog input channel. The AD converting section 6-2 converts the analog signal supplied by the multiplexer 4-2 into the digital signal within the conversion period. The digital signal after the conversion is stored in the appropriate result storing region "Channel 6" of the result storing buffer 8 in accordance with the data indicating the analog input channel CH6. At this time, as shown in (a) of FIG. 8, the AD converting section 6-2 outputs the conversion completion trigger signal to the DMA unit 20 immediately before the end of the conversion process of the analog signal on the analog input channel CH6 in accordance with the data indicating the AD conversion last analog input channel. The DMA unit 20 reads out the next channel specifying data "10100111" from the memory 30 in response to the conversion completion trigger signal, and supplies through the bus 12 to the channel specifying register 2-2. Thus, as shown in (b) of FIG. 8, the channel specifying register 2-2 latches and holds the channel specifying data "10100111" in response to the hold instruction from the DMA unit 20. In succession, as shown in (d) of FIG. 8, the DMA unit 20 reads out the stored digital signals from the result storing buffer 8 and stores in the memory 30 through the bus 12.

Through the foregoing process, the analog signals supplied to the AD converting section 6-2 for the respective analog input channels specified based on the channel specifying data "01010110" are converted from "CH1", to "CH2", "CH4" and "CH6". That is, the analog signals from the multiplexer 4-2 are converted into the digital signals by the AD converting section 6-2 and stored in the appropriate result storing regions of the result storing buffer 8. After that, these digital signals are read out from the buffer 8 and transferred to the memory 30 by the DMA unit 20. Immediately before the AD converting process corresponding to the single channel specifying data are ended, the conversion completion trigger signal is outputted, and the AD converting process is carried out to the next channel specifying data "10100111".

As mentioned above, in the AD converting apparatus according to the second embodiment of the present invention, the multiplexer 4-2 selects the analog input channels CH1, CH2, CH4 and CH6 in order in accordance with one channel specifying data "01010110". Thus, the AD converting section 6-2 can continuously carry out the AD conversion on the analog signals on the analog input channels CH1, CH2, CH4 and CH6. Also, the channel specifying data "01010110" is previously set in the channel specifying register 2-2 and the AD conversion is carried out to the analog signals on the analog input channels CH1, CH2, CH4 and CH6. Thus, the digital signals can be obtained at the proper timing without any wait or idle time in switching of the channels. In the AD converting apparatus according to the second embodiment of the present invention, all the necessary analog input channels CH1, CH2, CH4 and CH6 can be selected based on the channel specifying data, and it is possible to reduce the number of the necessary registers.

By the way, in the first and second embodiments, of the plurality of bits (the plurality of channel data CD0 to CDn) of the channel specifying data, the least significant bit (bit 0) indicates the first channel data CD0, and the most significant bit indicates the last channel data CDn. However, the most significant bit (bit n) may indicate the first channel data CDn, and the least significant bit (bit 0) may indicate the last channel data CD0. Also, the decoding process in the multiplexer 4-1 or 4-2 and the data associated with it, and the output of the conversion completion trigger signal, and the process for the address specification of the result storing buffer 8 in the AD converting section 6-1 or 6-2 may be processed by a separately installed controller (not shown).

According to the present invention, the AD conversion can be carries out continuously without any stop period or idle period. Also, the analog signals whose AD conversion cycles are different can be converted into the digital signals in the proper conversion cycles. Also, a software load can be reduced in the process for the AD conversion and the process for the result of the AD conversion. Moreover, the result in a chip size and a drop in power consumption can be accomplished through the reduction in the number of the installations of the AD converters.

What is claimed is:

1. An analog-to-digital (AD) converting apparatus, comprising:
   a register configured to hold channel specifying data comprising a plurality of 1-bit channel data each corresponding to one of a plurality of analog input channels and indicating individually whether a respective one of the plurality of analog signals should be subjected to an AD conversion;
   a selecting section connected with the plurality of analog input channels from which said plurality of analog signals are supplied, said selecting section configured to sequentially select ones of said plurality of analog input channels based on said channel specifying data held by said register; and
   an AD converting section configured to carry out said AD conversion of one or more particular analog signals of said plurality of analog signals that are supplied on said selected ones of said plurality of analog input channels, so as to convert the one or more particular analog signals into a corresponding one or more digital signals;

wherein said AD converting section is configured to generate a conversion completion trigger immediately before completion of said AD conversion of all of said one or more particular analog signals.

2. The AD converting apparatus according to claim 1, wherein each of said plurality of channel data is set to a predetermined state when said AD conversion is to be carried out for a respective analog signal on a respective analog input channel corresponding to said channel data; and wherein said selecting section is configured to search said plurality of channel data of said channel specifying data held by said register to find one or more set channel data of said plurality of channel data that have been set to said predetermined state, said selecting section further configured to select one or more specific analog input channels corresponding to the one or more set channel data as the selected ones of the plurality of analog input channels.

3. The AD converting apparatus according to claim 2, wherein said selecting section is configured to search said channel specifying data to find said one or more set channel data in order from a least significant bit of said channel specifying data.

4. The AD converting apparatus according to claim 2, wherein said selecting section is configured to search said channel specifying data to find said one or more set channel data in order from a most significant bit of said channel specifying data.

5. The AD converting apparatus according to claim 1, further comprising:

a buffer in which said AD converting section stores said one or more digital signals.

6. The AD converting apparatus according to claim 5, further comprising:

a bus; and a control section configured to read out said one or more digital signals from said buffer onto said bus.

7. The AD converting apparatus according to claim 5, further comprising:

a bus;

a memory;

a DMA unit; and a control unit configured to control said DMA unit to transfer said one or more digital signals from said buffer into said memory through said bus.

8. The AD converting apparatus according to claim 1, further comprising:

a memory for storing said plurality of particular channel specifying data; and a control section configured to read out a specific channel specifying data of said plurality of particular channel specifying data from said memory in response to an AD conversion command and set the read-out specific channel specifying data in said register.

9. The AD converting apparatus according to claim 8, wherein said control section is configured to read out a next channel specifying data of said plurality of particular channel specifying data from said memory in response to said conversion completion trigger and set the read-out next channel specifying data in said register.

10. The AD converting apparatus according to claim 1, further comprising:

a memory for storing the plurality of particular channel specifying data;

a DMA unit; and a control section configured to control said DMA unit to read out a specific channel specifying data of said plurality of channel specifying data from said memory in response to an AD conversion command and configured to set the read-out specific channel specifying data in said register.

11. The AD converting apparatus according to claim 10, wherein said AD converting section is configured to generate a conversion completion trigger immediately before completion of said AD conversion of all of said one or more particular analog signals; and wherein said control section is configured to control said DMA unit to read out a next channel specifying data of said plurality of particular channel specifying data from said memory in response to said conversion completion trigger and to set the read-out next channel specifying data in said register.

12. An analog-to-digital (AD) converting method, comprising:

holding, in a register, channel specifying data comprising a plurality of 1-bit channel data each corresponding to one of a plurality of analog input channels and indicating individually whether a respective one of the plurality of analog signals should be subjected to an AD conversion;

sequentially selecting ones of the plurality of analog input channels from which said plurality of analog signals are supplied, based on said channel specifying data;

carrying out said AD conversion of one or more particular analog signals of said plurality of analog signals that are supplied on said selected ones of said plurality of analog input channels, so as to convert the one or more particular analog signals into a corresponding one or more digital signals; and generating a conversion completion trigger immediately before completion of said AD conversion of all of said one or more particular analog signals.

13. The AD converting method according to claim 12, wherein each of said plurality of channel data is set to a predetermined state when said AD conversion is to be carried out for a respective analog signal on a respective analog input channel corresponding to said channel data; and wherein said selecting comprises:

searching said plurality of channel data of said channel specifying data to find one or more set channel data of said plurality of channel data that have been set to said predetermined state; and selecting one or more specific analog input channels corresponding to the one or more set channel data as the selected ones of the plurality of analog input channels.

14. The AD converting method according to claim 12, wherein said carrying out comprises:

storing said one or more digital signals in a buffer.

15. The AD converting method according to claim 14, further comprising:

reading out said one or more digital signals from said buffer into a memory.

16. The AD converting method according to claim 15, wherein said reading out comprises:

controlling a DMA unit to transfer said one or more digital signals from said buffer into said memory.

17. The AD converting method according to claim 12, further comprising:

reading out said channel specifying data from a memory in response to an AD conversion command to set the channel specifying data in said register.

18. The AD converting method according to claim 12, further comprising:

reading out a next channel specifying data from a memory in response to said conversion completion trigger to set the next channel specifying data in said register.

19. The AD converting method according to claim 18, wherein said reading out the next channel specifying data comprises:

controlling a DMA unit to read out said next channel specifying data from said memory in response to said conversion completion trigger to set the read-out next channel specifying data in said register.

* * * * *